United States Patent [19]

Nozuyama

[11] Patent Number: 5,184,067
[45] Date of Patent: Feb. 2, 1993

[54] SIGNATURE COMPRESSION CIRCUIT

[75] Inventor: Yasuyuki Nozuyama, Tokyo, Japan

[73] Assignee: Kabushiki Kaisha Toshiba, Kawasaki, Japan

[21] Appl. No.: 799,719

[22] Filed: Nov. 26, 1991

Related U.S. Application Data

[63] Continuation of Ser. No. 378,919, Jul. 12, 1989, abandoned.

[30] Foreign Application Priority Data

Jul. 12, 1988 [JP] Japan .................................. 63-171906

[51] Int. Cl.⁵ ..................... G01R 31/00; G01R 31/28
[52] U.S. Cl. ............................... 324/158 R; 324/73.1; 371/22.2; 371/22.4
[58] Field of Search .................. 324/158 R, 73.1; 371/22.2, 22.5, 22.3, 22.4, 25.1

[56] References Cited

U.S. PATENT DOCUMENTS

| | | | |
|---|---|---|---|
| 4,517,672 | 5/1985 | Pfleiderer et al. | 371/22.2 |
| 4,661,930 | 4/1987 | Tran | 371/21.3 |
| 4,768,196 | 8/1988 | Jou et al. | 371/22.4 |
| 4,789,821 | 12/1988 | Baschiera et al. | 371/22.4 |

FOREIGN PATENT DOCUMENTS

| | | |
|---|---|---|
| 0093947 | 11/1983 | European Pat. Off. |
| 0148403 | 7/1985 | European Pat. Off. |
| WO88/03291 | 5/1988 | PCT Int'l Appl. |

OTHER PUBLICATIONS

"Implementation of Diagnostics and Redundancy on a Programmable Logic Array", IBM Tech. Disc. Bull., vol. 28, #6, Nov. 1985, pp. 2371–2373.

Charles E. Stroud et al., *Proceedings of the National Communications Forum*, 40 (1986) Part II, Oak Brook, Illinois, USA, pp. 1176–1179.

Könemann et al., "Built-In Logic Block Observation Techniques," IEEE Test Conference, Cherry Hill, N.J., 1979, pp. 37–41.

*Primary Examiner*—Ernest F. Karlsen
*Assistant Examiner*—William J. Burns
*Attorney, Agent, or Firm*—Foley & Lardner

[57] ABSTRACT

A signature compression circuit is employed to test a logic circuit. The signature compression circuit comprises a linear feedback shift register (LFSR) that receives test data from the logic circuit, compresses the data and generates a signature (resultant data) of the test. Output terminals of the logic circuit are grounded via MOS transistors, respectively. When the MOS transistors are OFF, the test data are received by and compressed in the signature compression circuit to form a signature (resultant data) of the test, and the signature in the signature compression circuit is shifted when the MOS transistors are ON.

8 Claims, 6 Drawing Sheets

SIGNATURE COMPRESSION CIRCUIT

This application is a continuation of application Ser. No. 07/378,919, filed Jul. 12, 1989, now abandoned.

BACKGROUND OF THE INVENTION

1. Field of the Invention

The present invention relates to a signature compression circuit that latches test outputs from an object to be tested, compresses them in parallel and provides a signature (resultant data) of the test at the end of the test and reads the signature by scanning. Particularly, the invention is effective for simplifying the design of test circuits.

2. Description of the Prior Art

One method employed to analyze high speed integrated circuits is a parallel signature compression method. This method will be explained with reference to FIG. 1. In this figure, a combination circuit 1 is tested. A test input pattern is given to the combination circuit 1, which provides test outputs to an output register 3. The test outputs are compressed in the output register 3 in parallel. At the end of the test, a signature (resultant data) of the test is stored in the register 3. Analysis of the combination circuit 1 according to the parallel signature compression method will be explained in more detail.

Figure 1:
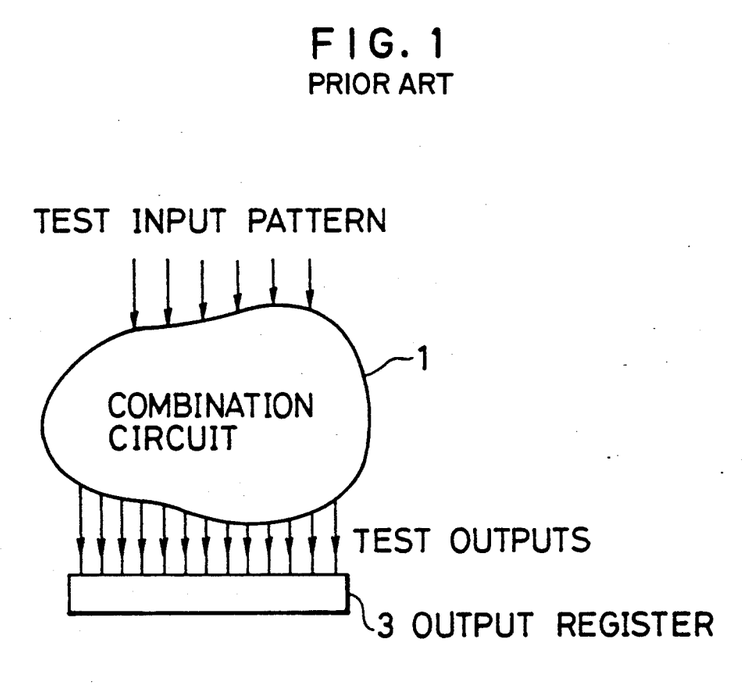
FIG. 1 is a view schematically explaining a test of a logic circuit.

The test outputs of the combination circuit 1 are fetched by the output register 3. The output register 3 operates as a linear feedback shift register (LFSR) with parallel inputs, and the test outputs of the combination circuit 1 are compressed in parallel in the output register 3.

A signature (resultant data) of the test which is generated by compressing the test outputs of the combination circuit 1 is read out of the output register 3 by scanning and transferring. Then, the externally read contents are compared with expected values. Based on the comparison, the combination circuit 1 is analyzed.

In this way, the output register 3 will latch the test outputs, compress them in parallel and carry out the scanning operation. To do so, the output register 3 is provided with hardware for realizing such operations.

Figure 2:
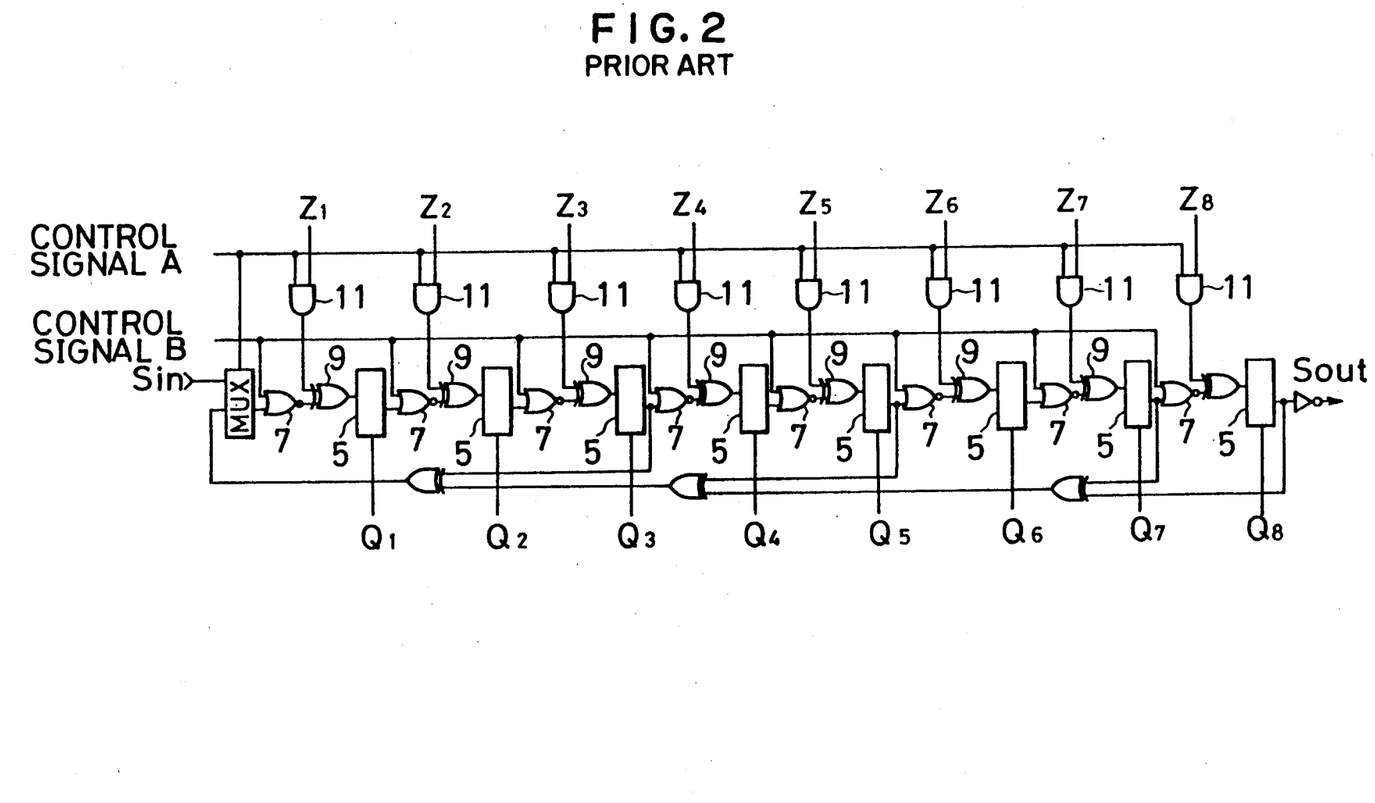
FIG. 2 is a circuit diagram showing a conventional signature compression circuit.

FIG. 2 shows a conventional signature compression circuit comprising an output register provided with such hardware for executing the parallel signature compression. The circuit of FIG. 2 is based on a built-in logic block observer (BILBO) system.

In this figure, test outputs of a combination circuit to be tested are eight bits (Z1 to Z8), and the output register comprises flip-flop circuits (hereinafter referred to as F/Fs) 5 corresponding to the eight bits of the test outputs, respectively. Each F/F 5 is connected to the next F/F 5 on the upper bit side via a negative OR (NOR) gate 7 and an exclusive OR (EXOR) gate 9. Each F/F 5 receives corresponding one of the test outputs via an AND gate 11 and the EXOR gate 9. One input of each AND gate 11 receives a control signal A, and one input of each NOR gate 7 receives a control signal B. These control signals A and B control the outputs of the gates 7 and 11.

When the control signal A is at a level of "1", the gates 11 are enabled so that the test outputs Zn are latched in the output register which may form a linear feedback shift register (LFSR). When the control signal B is at a level of "1", the gates 7 are disabled so that the F/Fs 5 will be independent of each other. In this way, the control signals A and B determine the function of the output register as a whole.

To compress the test outputs in parallel, the conventional signature compression circuit based on the BILBO system will have gate circuits such as the EXOR gates 9 and AND gates 11 inserted between the outputs of a circuit to be tested and the output register comprising the F/Fs 5.

Therefore, if the number of outputs of the circuit to be tested is large, the number of the gate circuits should be increased, i.e., areas occupied by the gate circuits in an integrated circuit should be increased, thus increasing the size of the integrated circuit.

Since the test outputs are provided to the F/Fs via the two stages of gate circuits, there are delays caused by the two stages of gate circuits. If high speed specifications are to be observed, it is hard to employ such conventional signature compression circuits, or, if employed, the specifications need to be loosened.

SUMMARY OF THE INVENTION

An object of the present invention is to provide a signature compression circuit that operates at high speed to receive test data within a short time.

Another object of the present invention is to provide a signature compression circuit comprising a small number of elements.

In order to accomplish the objects, the present invention provides a signature compression circuit comprising a linear feedback shift register (LFSR) and transistors that are arranged between output terminals of a logic circuit to be tested and a ground level. The transistors select for the output register a test data input mode or a compression mode and a scan mode. The logic circuit to be tested provides proportional type outputs or dynamic type outputs.

When the transistors are OFF, test data from the logic circuit to be tested are inputted to the output register which forms a LFSR and compresses the test data in the test mode. When the transistors are ON, all the output terminals of the logic circuit to be tested are grounded, and the data in the output register can be shifted. Instead of the ground level, a logic level may be used to embody the invention.

In addition to the logic circuits providing the ratiotype or dynamic type outputs, any other types of logic circuits may be tested by the invention, if the logic circuits cause no troubles when their output terminals are set to a predetermined logic level by means of transistors.

According to the invention, the transistors are switched over with a common control signal to set outputs of the logic circuit to be tested to a predetermined logic level so that a signature (resultant data) of the test already formed in the LFSR may be scanned.

These and other objects, features and advantages of the present invention will be more apparent from the following detailed description of preferred embodiments in conjuhntion with the accompanying drawings.

BRIEF DESCRIPTION OF THE DRAWINGS

FIG. 3 (A) is a circuit diagram showing a signature compression circuit according to the present invention;

DETAILED DESCRIPTION OF THE EMBODIMENTS

Figure 3A:
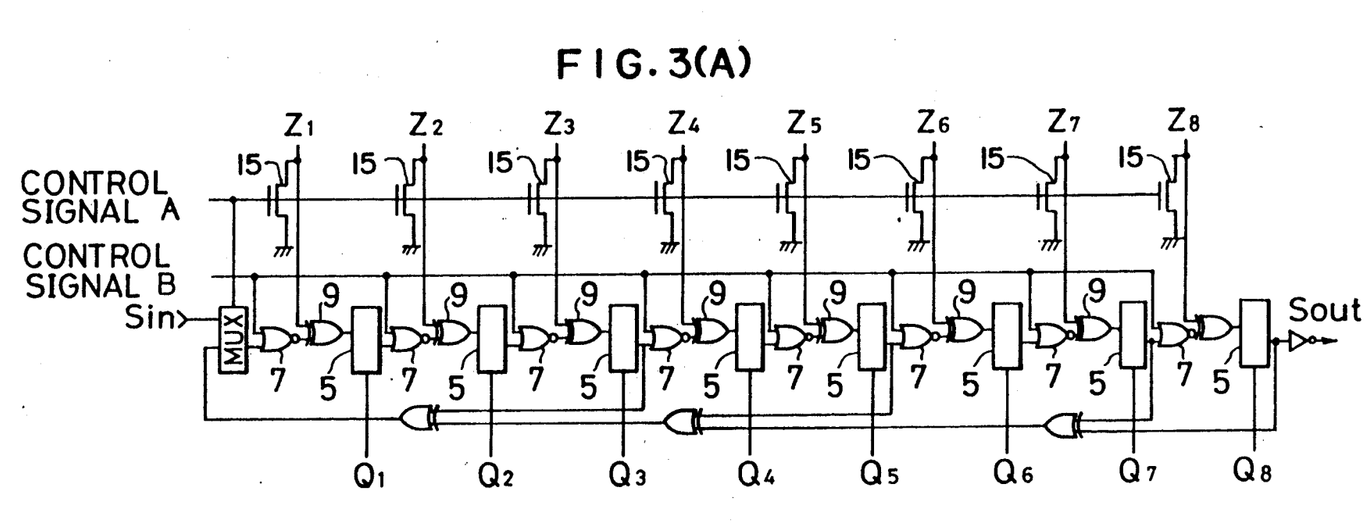

FIG. 3(A) shows a parallel signature compression circuit according to an embodiment of the invention. In this figure, parts corresponding to those shown in FIG. 2 are represented with like reference numerals. Although an 8-bit register is used as an output register in the embodiment, the larger the bit number the output register has, the higher the ability for finding out faults in a logic circuit to be tested becomes. It is practical to employ 32-bit registers.

In FIG. 3(A), input terminals Zn (n=1 to 8) of the output register are connected to output terminals of a logic circuit to be tested. The logic circuit is preferable to be of ratio-type or dynamic type. Each of the input terminals Zn is connected to a ground level via an NMOS transistor 15. A control signal A is provided to a gate terminal of each transistor 15. The output register comprises flip-flop circuits (hereinafter referred to as F/Fs) 5 corresponding to test outputs provided by the logic circuit to be tested, respectively. Each F/F 5 is connected to the next F/F 5 on the upper bit side via a negative OR (NOR) gate 7 and an exclusive OR (EXOR) gate 9. To each F/F 5, a corresponding one of the test outputs is provided through the EXOR gate 9. A control signal B is provided to one input of each NOR gate 7. The control signals A and B control outputs of the gates 7 and 9. Namely, the control signals A and B determine functions of the output registers.

Figure 3B:
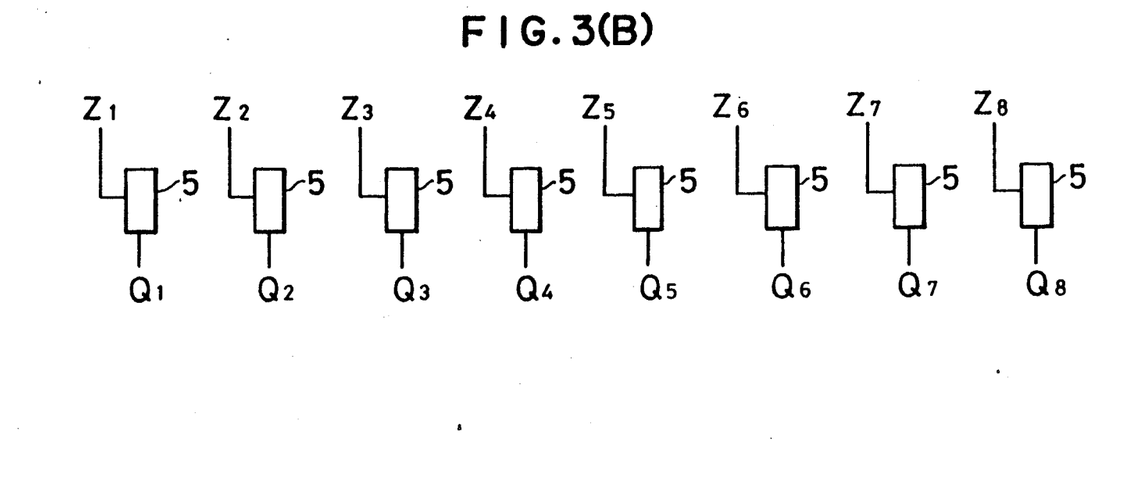
FIGS. 3(B) to 3(D) are views explaining operations of the signature compression circuit of the invention.

When the control signal A is at a level of "0" and the control signal B at a level of "1," an output of each NOR gate 7 will be 0. Since the transistors 15 are OFF with the control signal A of 0, the input terminals Zn receive test outputs. Then, the EXOR gates 9 output the test outputs, which are set in the corresponding F/Fs 5. The circuit to be tested operates in normal mode. Namely, the signature compression circuit shown in FIG. 3(A) functions as shown in FIG. 3(B).

Figure 3C:
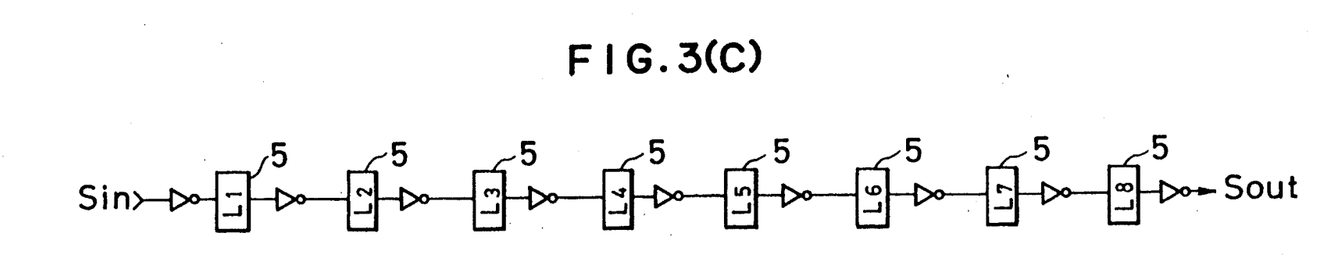

When the control signal A is "1" while the control signal B is "0," the transistors 15 are ON so that the input terminals Zn will each be 0. Then, an output of each NOR gate 7 will be an inverted output of the adjacent F/F on the lower bit side. In other words, an output of one F/F 5 is inverted and provided to the next F/F 5 on the upper bit side. Namely, test outputs latched in the F/Fs 5 are scanned and shifted toward upper bits, and read out. Here, the circuit of FIG. 3(A) forms a shift register as shown in FIG. 3(C) to transfer the signature of the test.

Figure 3D:
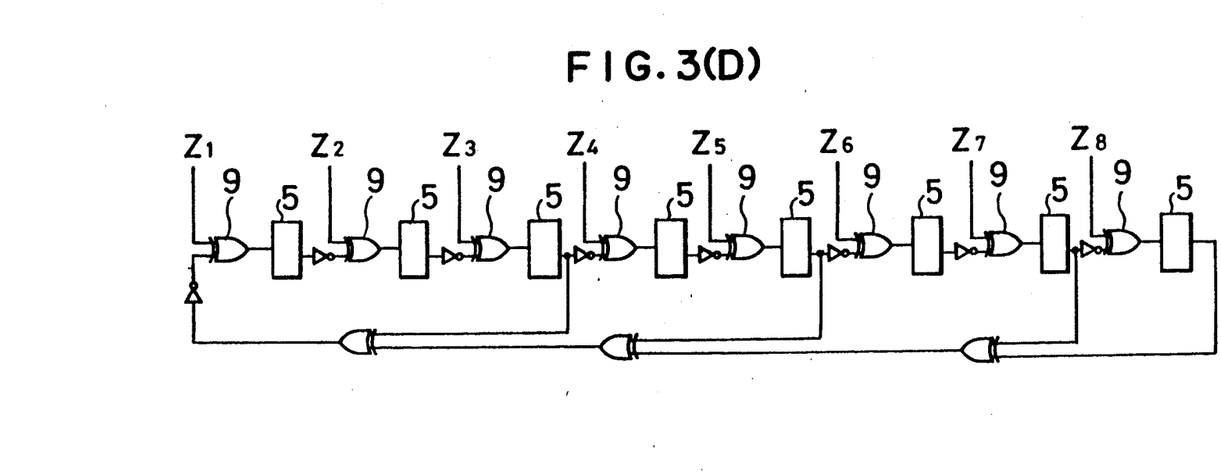

When the control signals A and B are both "0," each test output (signature) is provided to one input of a corresponding one of the EXOR gates 9, and an inverted output of the adjacent F/F 5 on the lower bit side is provided to the other input of the EXOR gate 9 in question. As a result, one test output provided to the input terminal Zi (i=1 to 8) is exclusively ORed with an inverted output $\overline{Q_{i-1}}$ of the F/F 5 of (i−1)th bit, and a result of the exclusively ORed operation is provided to the F/F 5 of (i)th bit. Namely, the test outputs are compressed in parallel to form a signature of the test. Here, the circuit of FIG. 3(A) forms a linear feedback shift register (LFSR) with parallel inputs as shown in FIG. 3(D) to compress the test outputs in parallel and generates a signature.

In compressing the test outputs, the EXOR gates 9 act as gates for carrying out the signature compression. The EXOR gates 9 may be exclusive negative OR gates. The test outputs provided to the input terminals Zi and to the gates 9 may be inverted and then provided to the gates 9, or the outputs of the F/Fs 5 that are inverted and provided to the gates 9 may be provided to the gates 9 without inverting them.

When the control signals A and B are both "1," all the input terminals Zn are 0, and all outputs of the NOR gates 7 are also 0. Therefore, inputs to the respective F/Fs 5 are each 1 to reset the F/Fs 5.

As described in the above, the signature compression circuit of FIG. 3 utilizes a combination of the control signals A and B to carry out the signature compression.

The invention does not employ the AND gates 11 of the conventional circuit of FIG. 1 in compressing the test outputs and scanning the signature, thereby reducing the number of elements and size of the parallel signature compression circuit. Since the test outputs are latched without passing through the AND gates 11, an the operation speed in normal mode is improved compared with the prior art.

Figure 4:
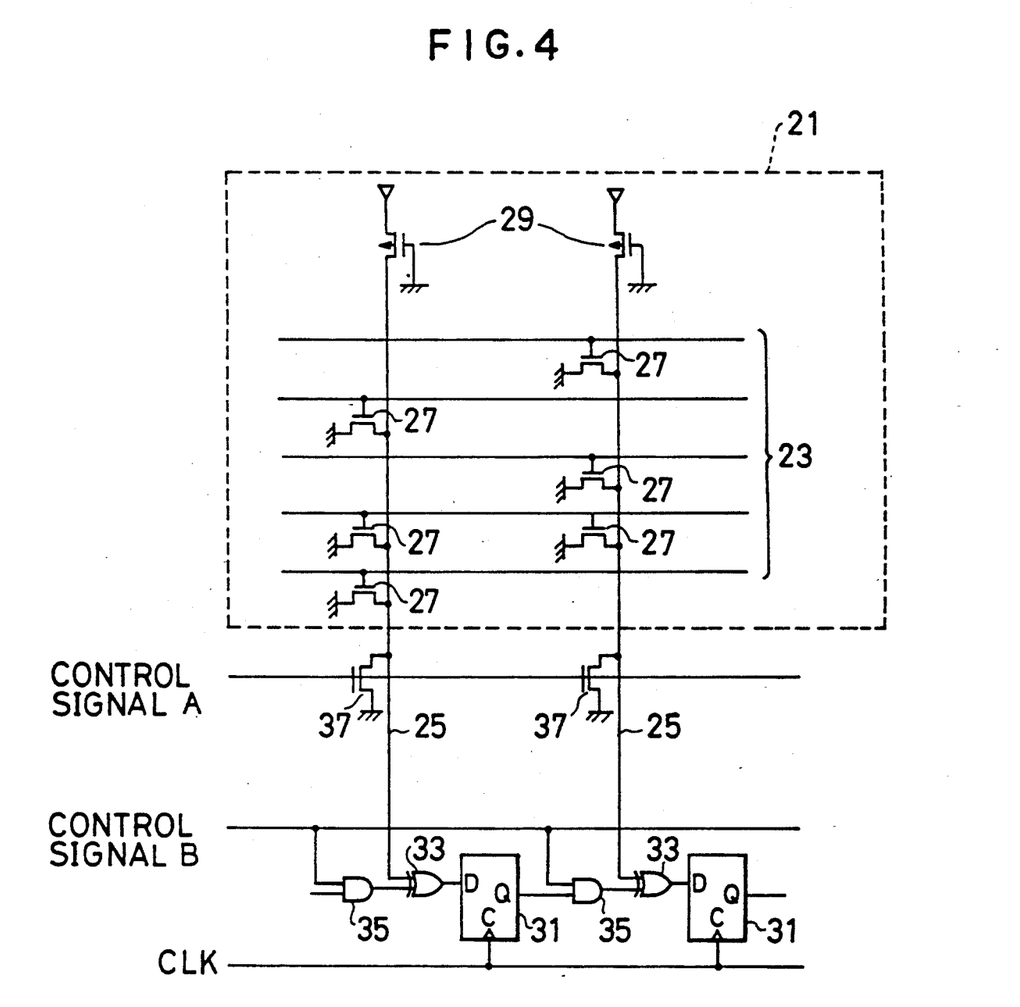
FIG. 4 is a circuit diagram showing part of an embodiment of the invention applied for testing a logic circuit that provides ratio-type outputs.

FIG. 4 is a view showing a logic circuit 21 to be tested according to the present invention. This logic circuit 21 is a programmable logic array (PLA) and provides ratio-type outputs. FIG. 4 shows only two bits of outputs of the circuit 21. In the PLA 21, and AND plane composed of input lines and product term lines is omitted, and only an OR plane is shown.

The OR plane comprises product term lines 23 that are output lines of the AND plane, and output lines 25 orthogonal to the product term lines 23. At predetermined intersections of the product term lines 23 and output lines 25, N-channel MOS transistors (hereinafter referred to as NMOS transistors) 27 are arranged. The NMOS transistors 27 are connected to the output lines 25 and grounded. A gate terminal of each of the NMOS transistors 27 is connected to a corresponding one of the product term lines 23. One end of each output line 25 is connected to a power source via a P-channel MOS transistor (hereinafter referred to as PMOS transistor) 29. A gate terminal of the PMOS transistor 29 is grounded.

Logic values of the output lines 25 are determined by logic values of the product term lines 23. Namely, one output line 25 outputs a logic value of 1, if the output line 25 is connected to one NMOS transistor 27 that is in an ON state because its gate terminal is connected to one product term line 23 having a logic value which is 2. The logic value "0" will be a low level potential determined by the ratio of ON resistance of one PMOS transistor 29 and one NMOS transistor 27 in an ON state.

On the other hand, the output line 25 outputs a logic value of 1, if all the product term lines 23 corresponding to the NMOS transistors 27 that are connected to the output line 25 in question are 0 to turn OFF the NMOS transistors 27 so connected. The outputs of the PLA 21 are provided as test outputs to a signature compression circuit.

In FIG. 4, the signature compression circuit comprises D-type flip-flops (F/Fs) 31 forming an output register, EXOR gates 33, AND gates 35 and NMOS transistors 37 that characterize the invention. Each one of the F/Fs 31, EXOR gates 33, AND gates 35 and NMOS transistors 37 constitutes a group to be arranged for each output line 25. In the signature compression circuit of FIG. 4, a feedback loop for forming a parallel input LFSR at the time of signature compression is omitted.

In FIG. 4, each F/F 31 corresponds to one bit of the output register. Each F/F 31 fetches data given to its input terminal D in response to a clock signal (CLK), and outputs the fetched data from its output terminal Q.

One input terminal of each EXOR gate 33 is connected to a corresponding one of the output lines 25, and the other input terminal of the EXOR gate 33 is connected to an output terminal of a corresponding one of the AND gates 35. An output terminal of the EXOR gate 33 is connected to the input terminal D of corresponding F/F 31. Similar to the EXOR gate 9 of FIG. 3, the EXOR gate 33 of FIG. 4 functions to compress signatures.

One input terminal of each AND gate 35 receives a control signal B, and the other input terminal of the AND gate 35 is connected to an output terminal Q of the adjacent F/F 31 on the lower bit side. The other input terminal of the AND gate 35 for the lowest bit is connected to an output terminal of a 2-input selector (FIG. 3). The 2-input selector is controlled by a control signal A. One input of the 2-input selector receives a scan output from another circuit block to be tested. The other input of the selector receives the feedback output of the LFSR. One AND gate 35 functions to receive an output of the adjacent F/F 31 on the lower bit side and transfer the same to the next F/F 31 on the upper bit side. This transfer operation is controlled by the control signal B.

Namely, if the control signal B is at a level of "0," outputs of the AND gates 35 will be each 0 so that logic values of the output lines 25 are provided to the input terminals D of the F/Fs 31 via the EXOR gates 33. Namely, test outputs of the PLA 21 provided to the output lines 25 are latched by the F/Fs 31 to perform a normal operation.

When the control signal B is at a level of "1," an output of one AND gate 35 is an output of the adjacent F/F 31 on the lower bit side. Therefore, a logic value of one output line 25 is exclusively ORed in the corresponding EXOR gate 33 with an output of the adjacent F/F 31 on the lower bit side. As a result, if the control signal A is at a level of "0," outputs of the PLA 21 provided to the output lines 25 are compressed in parallel. The outputs of the PLA 21 are controlled according to the NMOS transistors 37 and control signal A and provided to the output lines 25.

Each of the NMOS transistors 37 is connected to a corresponding one of the output lines 25 and grounded. Gate terminals of the NMOS transistors 37 commonly receive the control signal A so that the NMOS transistors 37 may be turned ON and OFF according to the control signal A. The gate length of the NMOS transistor 37 is substantially equal to or larger than that of the NMOS transistor 27 disposed at an intersection of the corresponding product term line 23 and output line 25. Accordingly, the ON resistance of the NMOS transistor 37 is substantially equal to or smaller than that of the NMOS transistor 27.

The NMOS transistors 37 will be turned OFF when the control signal A is at a level of "0." Then, test outputs of the PLA 231 are provided to the output lines 25. If the control signal B is at level 0, the test outputs are latched as they are by the F/Fs 31. If the control signal B is at level 1, the test outputs are compressed in parallel and fetched by the F/Fs 31.

When the test outputs are fetched by the F/Fs 31, the junction capacitance of each NMOS transistor 37 is added to each output line 25. However, usually the junction capacitance is negligibly small compared to the total capacitance connected to each output line 25. Therefore, the speed of providing outputs from the PLA 21 is substantially equal to that with no NMOS transistors 37 connected to the output lines 25.

When the control signal A is at level 1, all the NMOS transistors 37 are turned ON. Therefore, all the output lines 25 provide logic values each of 0. Then, an output of one F/F 31 is transferred to the next F/F 31 on the upper bit side via the corresponding AND gate 35 and EXOR gate 33, thus carrying out a scan operation.

As explained with reference to FIG. 3, the AND gates 35 and EXOR gates 33 may be replaced with other logic gates having smaller areas, if such gates can achieve the parallel signature compression.

Figure 5:
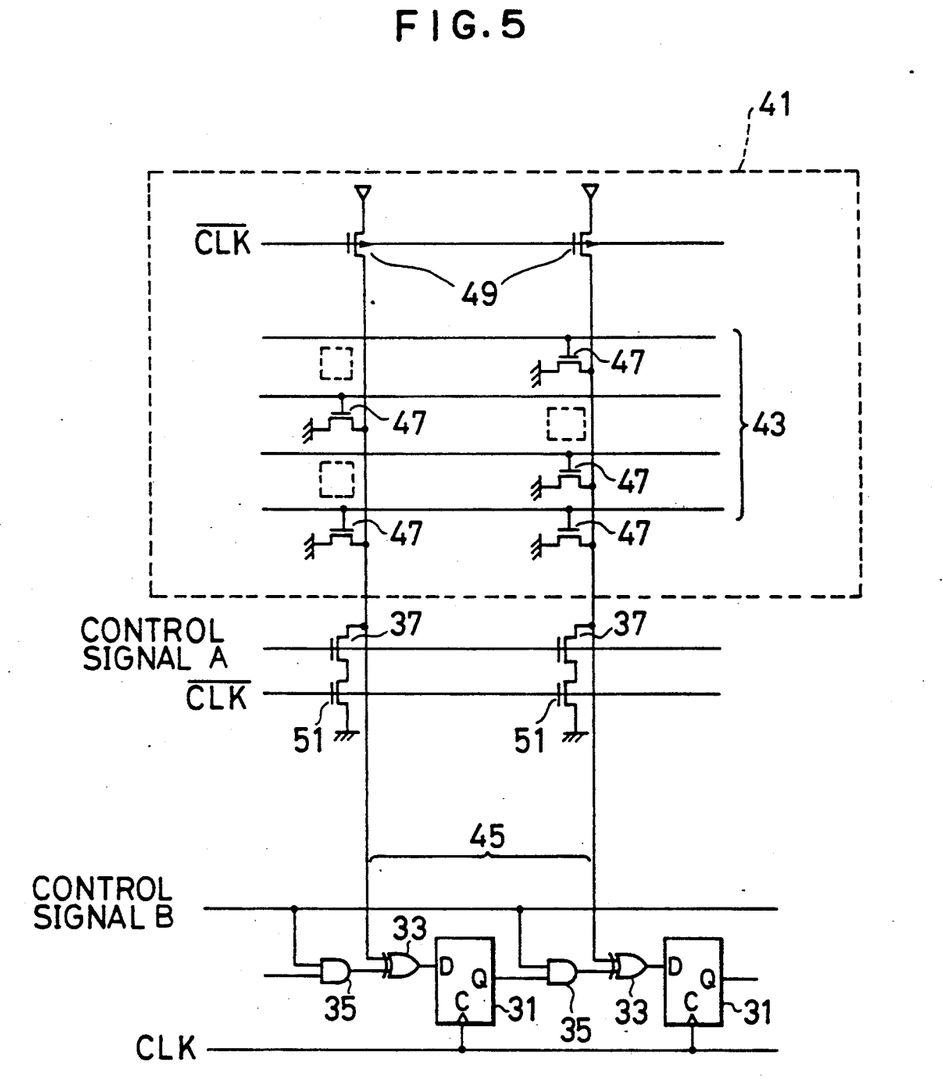
FIG. 5 is a circuit diagram showing part of an embodiment of the invention applied for testing a logic circuit that provides dynamic type outputs.

FIG. 5 shows a signature compression circuit applicable for a logic circuit providing dynamic type outputs, according to another embodiment of the invention.

This embodiment tests a precharge type NOR-ROM 41. In FIG. 5, the same parts as those shown in FIG. 4 are represented with like reference numerals and their explanations will be omitted. In FIG. 5, a feedback loop for achieving a parallel input LFSR is omitted.

In FIG. 5, the ROM 41 has word lines 43 and bit lines 45 which form output lines and are orthogonal to the word lines 43. At predetermined intersections, NMOS transistors 47 are connected to the bit lines 45 and grounded. A gate terminal of each NMOS transistor 47 is connected to a corresponding one of the word lines 43.

Each bit line 45 is connected to a power source via a precharging PMOS transistor 49. A gate terminal of each PMOS transistor 49 receives an inverted clock signal (CLK) derived by inverting a clock signal (CLK). While the clock signal is being at a level of 1, the bit lines 45 are precharged. At this time, to secure the precharging, all the word lines 43 are set to level 0 so that all the NMOS transistors 47 are turned OFF. On the other hand, while the clock signal is at level 0, the bit lines 45 receive an output corresponding to potentials of the word lines 43 that turn ON and OFF the NMOS transistors 47 connected to the bit lines 45.

The signature compression circuit of the embodiment for testing such a ROM 41 is provided with, in addition to the arrangement shown in FIG. 4, NMOS transistors 51 for securing precharge.

Each NMOS transistor 51 is connected to a corresponding one of the NMOS transistors 37 and grounded. A gate terminal of the NMOS transistor 51 receives an inverted clock signal. Namely, each bit line 45 is grounded via the corresponding NMOS transistor 37 and NMOS transistor 51 which are connected in series. If a clock signal is at level 1 during a precharging period of the bit lines 45, the NMOS transistors 51 are turned OFF. Therefore, the bit lines 45 are precharged securely.

With this arrangement, when the clock signal is at level 0 during a period of outputting data of the ROM 41, the NMOS transistors 51 are turned ON. Therefore, similar to the previous embodiment, the normal operation, parallel signature compression operation and scanning operation are carried out based on the control signals A and B.

If it is arranged that a signal derived by operating an AND function of the control signal A and inverted clock signal ($\overline{CLK}$) is provided to gate terminals of the NMOS transistors 37, the NMOS transistors 51 may be omitted.

Therefore, this invention can provide the same effect as that provided by the embodiment of FIG. 4. The signature compression circuits shown in FIGS. 4 and 5 can easily be assembled in ROMs, RAMs, PLAs, etc., that are appropriate to be tested according to the parallel signature compression method.

As described in the above, the present invention turns ON (or OFF) transistors to put test outputs in a predetermined logic level to carry out a scan operation. With this arrangement, the invention can reduce the size of the structure and improve the operation speed.

Various modification will become possible for those skilled in the art after reviewing the teachings of the present disclosure without departing from the scope thereof.

What is claimed is:

1. A test circuit comprising:
a signature compression circuit having a plurality of flip-flops connected in series to each other with gate circuits interposed between adjacent flip-flops, said gate circuits being connected to a first common signal line and coupled respectively to all output nodes of a logic circuit to be tested to receive outputs of said logic circuit, each gate circuit carrying out a logical operation on one output of said logic circuit and an output of one flip-flop to carry out signature compression of an output pattern including outputs of said logic circuit when a first common signal level on said first common signal line is signalled, each gate circuit supplying said outputs of said logic circuit respectively to said flip-flops and isolating said flip-flops from each other to output said outputs of said logic circuit through said signature compression circuit when said first common signal level is not signalled; and
a plurality of transistors connected between at least one node at a logical level and said output nodes of said logic circuit respectively, gate terminals of said transistors being connected to a second common signal line such that said transistors are turned on at the same time and all of said output nodes of said logic circuit are forced to be at said logical level in accordance with a second common signal level of said second common signal line, wherein said gate circuits enable shift operation of said signature compression circuit to shift out a test pattern stored in said flip-flops when said second common signal level is signalled on said second common signal line.

2. The circuit as claimed in claim 1, wherein each of said transistors is a metal oxide semiconductor field effect transistor (MOSFET).

3. The circuit as claimed in claim 1, wherein said logic circuit to be tested provides ratio-type outputs.

4. The circuit as claimed in claim 3, wherein said logic circuit to be tested is a programmable logic array (PLA).

5. The circuit as claimed in claim 1, wherein said logic circuit to be tested provides dynamic type outputs.

6. The circuit as claimed in claim 5, wherein said logic circuit to be tested is a precharged-type ROM.

7. The circuit as claimed in claim 1, wherein said signature compression circuit is a linear feedback shift register (LFSR) with parallel inputs.

8. The circuit as claimed in claim 5, wherein each of said transistors is connected in series with another transistor which is turned on and off in response to clock signals.

* * * * *